United States Patent [19]

Benedetto et al.

[11] Patent Number: 5,355,791
[45] Date of Patent: Oct. 18, 1994

[54] ALL-IN-ONE SCREEN PRINTING MACHINE

[75] Inventors: John R. Benedetto; William Gillespie, Jr., both of Everett, Wash.

[73] Assignee: Universal Screen Printing, Inc., Everett, Wash.

[21] Appl. No.: 109,687

[22] Filed: Aug. 20, 1993

[51] Int. Cl.⁵ .............................................. B41F 15/06
[52] U.S. Cl. ................................. 101/126; 101/127.1; 101/128.4
[58] Field of Search ...................... 101/114, 126, 127.1, 101/128, 128.1, 128.21, 128.4, 424.1, DIG. 36

[56] References Cited

U.S. PATENT DOCUMENTS

| | | | |
|---|---|---|---|
| 1,828,771 | 10/1931 | Flockhart | 101/126 |
| 3,643,597 | 2/1972 | Lala | 101/128.21 |
| 3,964,385 | 6/1976 | Knight | 101/128.4 |
| 4,073,232 | 2/1978 | Brewer | 101/128.1 |
| 4,896,597 | 1/1990 | Hayata et al. | 101/128.21 |
| 4,981,076 | 1/1991 | Cunill | 101/127.1 |
| 5,048,417 | 9/1991 | Everroad | 101/128.4 |
| 5,094,161 | 3/1992 | Taylor | 101/126 |

FOREIGN PATENT DOCUMENTS 122597  5/1988  Japan .................. 101/128.4

OTHER PUBLICATIONS

Compac Systems, *RX-22 Textile Printer–The Complete Screen Printing System* Brochure.

Primary Examiner—David A. Wiecking
Assistant Examiner—Stephen R. Funk
Attorney, Agent, or Firm—Christensen, O'Connor, Johnson & Kindness

[57] ABSTRACT

A screen printing machine for: (i) creating an image-bearing screen; (ii) using the image-bearing screen to create prints on suitable substrates; and (iii) heating the print to cure the print ink. The machine includes an open front cabinet (11) having a mid-level shelf (39) that supports a series of ultraviolet (UV) lamps (41). Recesses (49) in the upper ends of the cabinet walls (31, 33) receive a work surface (21) that supports the image to be printed and a print screen (23). The image is preprinted on a sheet of material (20) that passes UV light except where the image is located. When the UV lamps are energized, a photographic emulsion previously coated onto the screen hardens, except in the area of the image (61). After exposure, the emulsion is washed, to remove unhardened emulsion and create a stencil-like printing screen. Then, the UV lamps (41) are covered (15) and a platen (55) is positioned just below the plane of the recesses (49). After a garment (63) is positioned on the platen (55), the screen (23) is returned to the recesses (49), after ink is applied to the top side of the screen. A squeegee is used to press the mesh (59) of the print screen (23) against the garment (63) and move ink through openings in the mesh (59). Then, the print screen (23) is removed and the ink is heated (25). Thereafter, the process is repeated for additional images or colors. After all colors are applied, the inks are heated (25) until cured. Spring-loaded pins (71) located along one of the screen receiving recesses press the print screen against the opposite recess creating side-to-side indexing. Front-to-back indexing is provided by pulling the frame (57) against the rear wall (35) of the cabinet (11). The machine can be used as an artist's light table by installing a translucent sheet (19) beneath the transparent support plate (21).

18 Claims, 3 Drawing Sheets

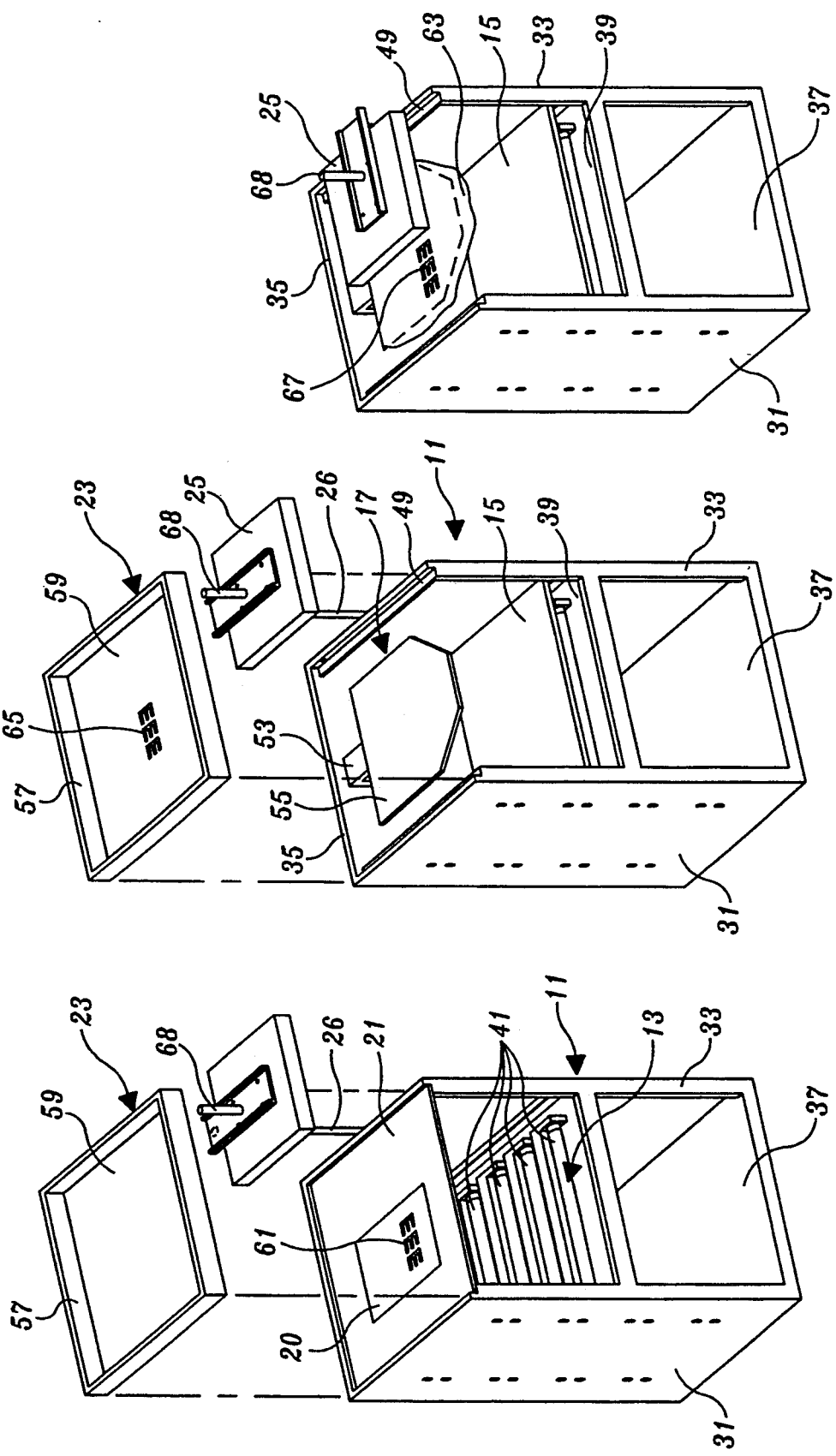

ALL-IN-ONE SCREEN PRINTING MACHINE

FIELD OF INVENTION

Technical Area

This invention relates to screen printing and, more particularly, to machines for screen printing designs on suitable substrates, such as textile fabrics.

BACKGROUND OF THE INVENTION

Screen printing is an old and established way of creating designs on various substrates, such as textile fabric, paper, metal, wood, glass, etc. Screen printing is essentially a stencil method of printing where the stencil is formed by a screen stretched over a wooden or metal frame. For finer detail, a finer-meshed screen is used.

Early versions of screen printing used silk to form the screen. A design was created by painting the screen with a greasy medium The pores of the silk were then closed using a suitable gum. The pores of the silk in the areas covered by the greasy medium were not closed because the greasy medium rejected the gum. Thereafter, the greasy medium was washed away with a solvent, such as turpentine if paint was used as the greasy medium, resulting in the corresponding areas becoming pervious to ink. The screen was then placed on the surface of the substrate to be decorated and ink was applied through the screen to the surface using a rubber squeegee. The ink soaked through the pervious areas of the silk and was imprinted on the surface.

More recent versions of screen printing use fine mesh screen materials other than silk. The chosen screen material is coated with a photographic emulsion. The photographic emulsion is exposed to a suitable source of light with the image to be reproduced being located between the light and the emulsion. The light causes the emulsion to harden except in areas where the image is located. Thereafter the screen is washed, which removes the emulsion from the areas where it has not been hardened by the light, i.e., the image areas. Then, the screen is to print a design on a substrate.

In recent times, screen printing has been widely used to create a variety of single and multicolored designs on a variety of textile fabric items, particularly clothing such as T-shirts and sweatshirts. Various machines have been developed to improve screen printing. Unfortunately the majority of such machines, particularly those designed to create multicolored designs, are large and complex and, thus, expensive. Others are heavy, cumbersome, deteriorate rapidly and lack adjustability. One machine in particular is heavy and cumbersome because it is made of pressed wood. Pressed wood deteriorates rapidly when subject to the high heat generated during the curing of screen printed designs. This same machine lacks an adjustable height platen and a precise screen registration mechanism. The present invention is directed to providing a low-cost, easy to use, precisely made and easily adjustable all-in-one screen printing machine suitable for creating both single and multiple color designs.

SUMMARY OF THE INVENTION

In accordance with this invention an all-in-one screen printing machine that can be easily reconfigured to: (i)create an image-bearing screen; (ii)use the image-bearing screen to print designs on textile fabrics and other suitable substrates; and (iii) heat the designs to set the print ink is provided. The machine can also be used to provide a diffused light table for use in heating art work for use in screen printing. The machine includes a metal cabinet with a horizontal shelf located beneath the top of the cabinet. Mounted on the metal shelf is a source of ultraviolet (UV) light. The upper ends of the metal cabinet walls are configured to receive a work surface suitable for supporting an image of the design to be printed and a framed screen. The image is preprinted on a sheet of material that passes UV light except where the image is located; and the screen is coated with a photographic emulsion. When exposed to UV light, the photographic emulsion hardens, except where the image prevents the light from striking the emulsion. After exposure, the emulsion is washed to remove the remaining soft unexposed (image) parts of the emulsion, creating a print screen. The all-in-one screen printing machine also includes an adjustable platen, preferably formed of metal, that is positionable just below the upper walls of the cabinet. The platen is suitable for supporting a piece of textile fabric, preferably in the form of a garment, such as a T-shirt, or other substrate suitable for receiving a print ink. The textile fabric or other substrate is mounted on the platen, which is positioned just below the print screen; and a squeegee is used to push the ink through the image apertures in the screen onto the fabric. The all-in-one screen printing machine also includes a heater positionable above a printed item to heat and cure the ink after it is applied.

In accordance with additional aspects of this invention, the UV light source is formed by a plurality of UV lamps mounted on the shelf.

In accordance with other aspects of this invention, the platen is supported by a mechanism that allows the platen to be raised and lowered and horizontally oriented.

In accordance with still further aspects of this invention, recesses located about the upper ends of the cabinet walls are sized and shaped to receive the frame that supports the print screen. Registration means located in the recesses allow a screen to be removed after printing to check a design and reinstalled for further printing in cases where the design has been incompletely printed.

In accordance with yet still further aspects of this invention, multiple screens are used to create multicolor images. The screens are mounted in seriatim in the recesses located atop the walls of the cabinet. After each ink is printed, the inks may be heated to a gel or partial curing temperature prior to another screen and additional ink being applied. After the final ink is applied, all of the inks are heated to their final curing temperature.

As will be readily appreciated from the foregoing description, the invention provides an all-in-one screen printing machine that is easily reconfigured to create a print screen, use the print screen to print designs, and heat the designs to cure them. Multicolor images can be created, without limit as to the number of colors. Because the all-in-one machine is relatively uncomplicated, it is inexpensive to manufacture. Because the cabinet is formed of metal, the machine can be precisely made and does not deteriorate as a result of the temperatures generated during curing of screen printed designs. The inclusion of a vertically adjustable platen and an accurate screen registration mechanism improves the desirability of screen printed items created by the machine.

BRIEF DESCRIPTION OF THE DRAWINGS

The foregoing features and advantages of this invention will become more readily appreciated as the same becomes better understood by reference to the following description of a preferred embodiment of the invention, when taken in conjunction with the accompanying drawings, wherein:

FIGS. 2A, 2B, and 2C are a series of diagrams illustrating how the various components of the screen printing machine illustrated in FIG. 1 are configured to create a print screen and then use the print screen to print a design on a substrate, such as a cloth T-shirt;

DESCRIPTION OF THE PREFERRED EMBODIMENT

Figure 1:
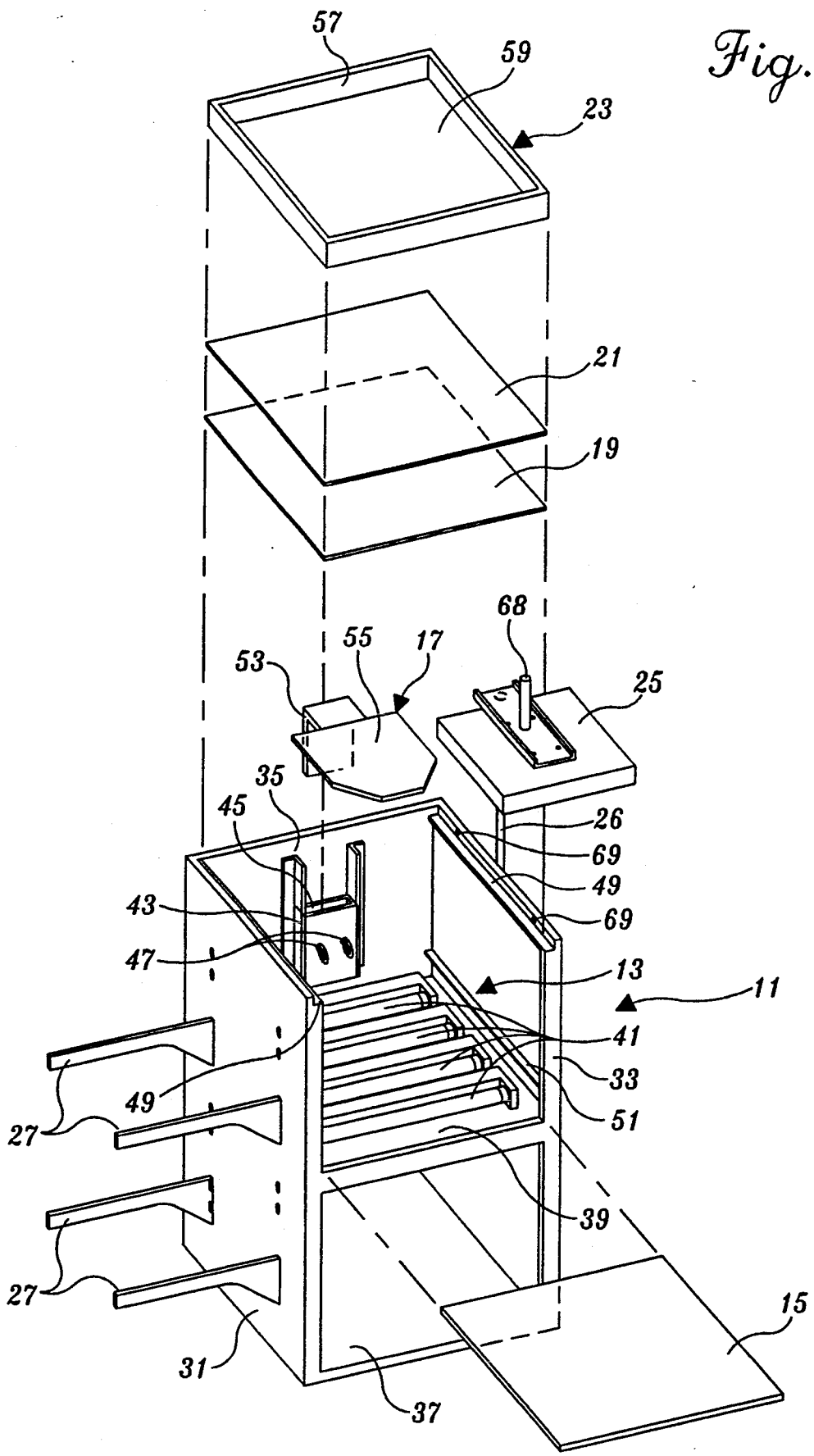
FIG. 1 is an exploded view of a preferred embodiment of a screen printing machine formed in accordance with the invention that illustrates all of the major components of the machine.

As illustrated in FIG. 1, an all-in-one screen printing machine formed in accordance with the invention comprises: a cabinet 11; a UV light source 13; a cover 15; a platen assembly 17; a transparent support plate 21; a print screen 23; and a heater 25. The all-in-one screen printing machine may also include an optional translucent sheet 19 and a plurality of shelf brackets 27. The cabinet 11 is formed of sheet metal and has an open front and an open top. Thus, the cabinet 11 is defined by a pair of metal side walls 31 and 33, a metal back 35, and metal bottom 37. The cabinet 11 also includes a mid-level metal shelf 39.

The mid-level metal shelf 39 supports the UV light source 13. Preferably the UV light source comprises a plurality of fluorescent lamps 41 that emit ultraviolet (UV) light. The lamps 41 are mounted atop the mid-level metal shelf 39. Affixed to the back 35, above the UV light source is a bracket 43. The bracket 43 includes a vertical aperture 45. Located on the front face of the back bracket 43 in alignment with the vertical aperture 45 are a pair of adjustment screws 47. The adjustment screws 47 are threaded into the front of the bracket 43.

The upper edges of the side walls 31 and 33 of the cabinet 11 include recesses 49. The recesses 49 are formed by creating ledges in the inner surfaces of the upper edges of the side walls 31 and 33. The cover 15 is sized to rest on rails 51 mounted on the inner faces of the side walls 31 and 33 on either side of the lamps 41 and positioned such that when the cover 15 lies atop the rails, the lamps 41 are covered to protect them from debris.

Figures 3A, 3B:
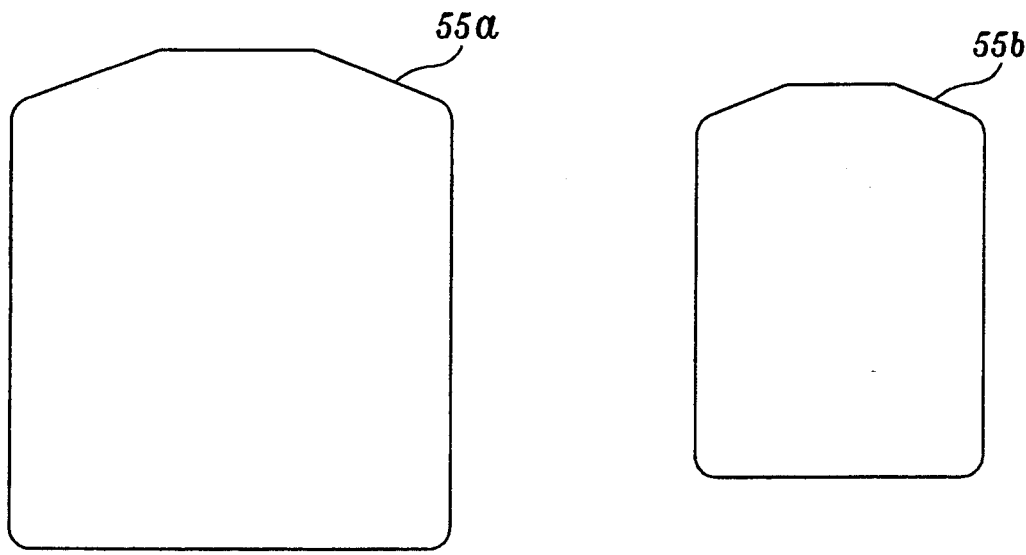
FIGS. 3A, 3B, and 3C illustrate various platen configurations suitable for use in the embodiment of the invention illustrated in FIGS. 1 and 2.
Figures 3C, 4:
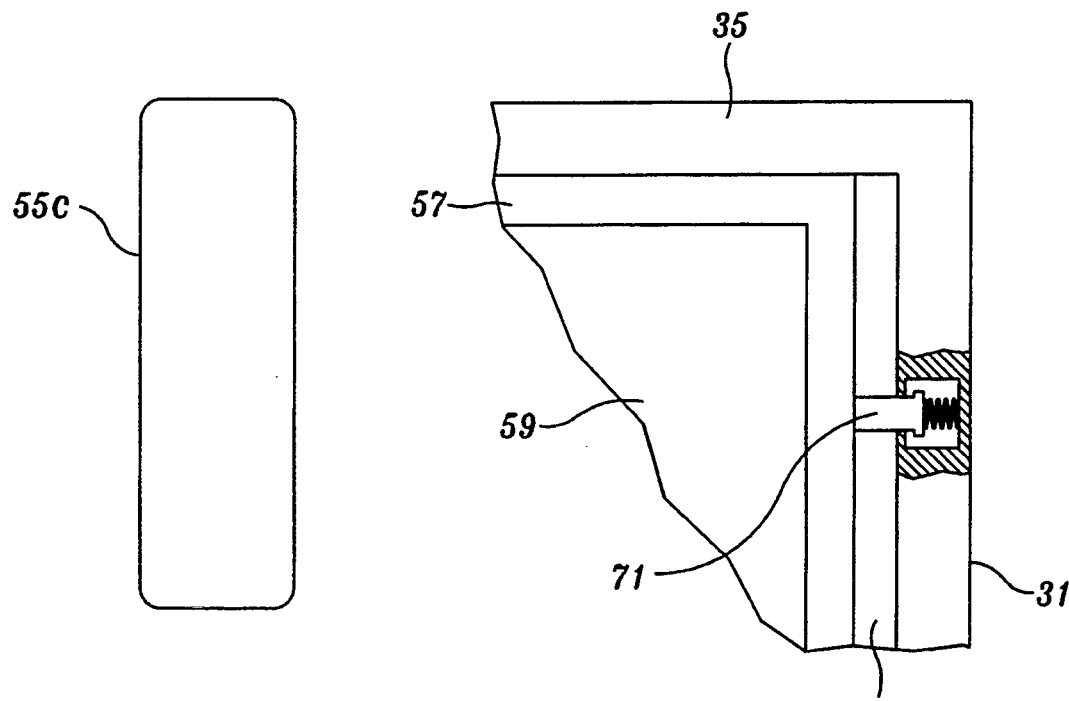
FIG. 4 is an enlarged partial plan view showing details of the indexing mechanism included in the embodiment of the invention shown in FIGS. 1 and 2.

The platen assembly 17 includes an L-shaped arm 53 and a platen 55, both formed of metal. The L-shaped arm has a vertical leg sized to fit inside of the aperture 45 in the bracket 43. The L-shaped arm also includes a horizontal leg that supports the platen 55. As illustrated in FIGS. 3A, 3B, and 3C, and described below, the platen 55 can take on a variety of configurations.

The translucent sheet 19 is formed of a suitably stiff, translucent material, such as plastic, that diffuses ultraviolet (UV) rays. The transparent support plate 21 is preferably formed of glass. The translucent sheet 19 and the transparent support plate are rectangular and sized to lie in the recesses 49 formed atop the side walls 31 and 33 of the cabinet 11. When both the translucent screen and the transparent support plate are mounted on the recesses, and the lamps 41 lit, an artist light table is created.

The print screen 23 includes a rectangular frame 57, preferably formed of metal, such as aluminum. Stretched across the lower surface of the frame 57 is a suitably fine mesh 59. The number of strands per inch of the mesh determines the detail of the designs created using the screen printing machine in the manner described below. Strands per inch normally range from 25 strands per inch to 495 strands per inch, with the larger number creating finer detail images. A common size is 110 strands per inch. The rectangular frame 57 is also sized to fit in the recesses 49 located atop the side walls 31 and 33 of the cabinet 11.

The shelf brackets 27 (only two of which are shown in FIG. 1) are mounted in holes located in one of the side walls 31. The holes are oriented such that pairs of shelf brackets can be aligned to create supports for print screens 23.

Prior to using the screen printing machine to create an image-bearing print screen and, then, use the print screen to create a design on a substrate, such as a garment formed of a textile fabric, artwork must be created. Artwork can be created by simply copying a pre-existing image, such as a logo, or having a commercial artist create an image. In any event, the image is first copied onto a film or paper that passes UV light. This can be accomplished by placing the image on the original surface of a photocopy machine and running a piece of UV-passing translucent paper through the machine. After the image to be printed is created on the UV-passing translucent paper in this relatively inexpensive manner, the paper is mounted in the screen printing machine configured in the manner shown in FIG. 2A and described next.

As shown in FIG. 2A, the screen printing machine is configured to create an image on a framed screen 59 by removing the cover 15, if it is not already removed, so that the UV tubes 41 are exposed. Then, the transparent support plate 21 is placed atop the cabinet 11, in the recesses 49. The image-bearing UV paper 20 is then placed on the glass plate 21 in the desired position.

Next, a previously prepared screen 23 is placed atop the glass plate 21. The screen is prepared by coating the mesh 59 with a photographic emulsion. During and after coating with a photographic emulsion, the screen 23 must be maintained in a "darkroom," i.e., a room that does not contain emulsion-exposing light. After the coated screen is placed atop the glass plate 21, the ultraviolet lamps 41 are energized. Energization of the ultraviolet lamps exposes and hardens the photographic emulsion in all areas except the areas covered by the image 61. After exposure, the screen is washed to remove the still soft emulsion lying in the area covered by the image 61. As a result, a print screen in the form of a stencil is created. The screens can be stored during and after creation of the shelf brackets 27 that protrude outwardly from one of the walls 31 of the cabinet 11.

FIG. 2B illustrates how the screen printing machine is configured to print a design on a suitable substrate using an image-scanning print screen 23 created in the manner illustrated in FIG. 2A and described above. First, the cover 15 is installed over the UV lamps 41 to protect the lamps from ink and other debris. Next, the platen assembly 17 is mounted in the bracket 43. More specifically, the vertical leg of the L-shaped arm 53 is mounted in the aperture 45 in the bracket 43. The platen assembly is positioned such that the upper surface of the platen 55 lies just below the lower edges of the recess 49, which is also just below the "screen" side of the mesh 59 supported by a frame 57 mounted in the recesses 49. Positioning is accomplished by raising or lowering the platen assembly 17 until the platen 55 is in the right position. The platen assembly can be slightly rocked back and forth in the channel 45 in order to assure that the upper surface of the platen 55 lies parallel to the lower surface of the screen mesh 59. One screw 43 can be rotated slightly inwardly to clamp one side of the vertical leg of the L-shaped arm 53, the platen rocked, and the other screw tightened. In any case, after the correct position is achieved, the screws 47 are tightened to lock the L-shaped arm 53 and, thus, the platen 55 in position. During positioning, the garment 63 or other substrate (not shown in FIG. 2B) is positioned on the platen 55. The platen 55 is positioned such that a small space (approximately ⅛ inch) is located between the garment and the lower surface of the mesh 59.

Next, the frame 57 bearing the image 61 is mounted in the recesses 49 in the upper walls of the cabinet 11. Prior to installing the frame 23, or after installation, ink is applied to the upper or ink side of the mesh 59. After being suitably positioned, just out of touch with the garment 63 located on the platen 55, a squeegee is moved across the screen 59 forcing ink through the image apertures defined by the stencil image 65. As a result, an image is printed on the garment 63 (or other substrate) mounted on the platen 55.

After the design is printed, the ink must be heated to cure. If multiple colors are to be overlaid to create a multicolor design, each ink can be heated a sufficient amount to make it gel after it is applied, if desired. After all inks are applied, they are heated to a curing temperature.

FIG. 2C illustrates how the screen printing machine is configured to heat a printed item, such as a garment 63 located on the platen 17. The screen 23 is, of course, removed. Thereafter, the heater 25, which is mounted atop a vertically adjustable pole 26 supported by a bracket (not shown) affixed to the side 33 of the cabinet 11, is rotated using a handle 68 so as to overlie the platen 55 and, thus, the garment 63 bearing the design 67. Preferably the heater is vertically adjustable by slidably mounting the pole in the bracket. A pin passing through the bracket and an aligned hole in the pole holds the heater vertically, height being controlled by which hole of several is selected.

After adjustment, the heater is energized, heating the platen and, thus, the shirt to a temperature sufficient to cause the ink to cure. The temperature, of course, depends upon the nature of the ink. Plastisol inks require heating to a temperature of approximately 350° to cause cross-linking to occur. Some inks cure at a lower temperature. In fact, some inks even air-dry. Heating, of course, increases drying speed and, thus, decreases drying time, regardless of the nature of the ink. After curing, the heater 25 is rotated to the side using the handle 68, and the printed item 63 is removed. Preferably the cover 15 remains over the fluorescent lamps, to protect them from damage during curing.

In summary, a screen printing machine formed in accordance with this invention is an all-in-one machine that can be configured to carry out the three major steps of screen printing—creating an image-bearing print screen; using the screen to print a design on a garment; and curing the ink used to print the design. Multicolored images can be easily created by simultaneously overlaying the print receiving surface with different previously created image-bearing screens. In between printing, preferably, previous images can be partially cured, i.e., gelled, to prevent colors from mixing.

Preferably the screen in combination with the recess includes an indexing mechanism 69 so that a screen can be removed and the print observed. If the print is incomplete, the indexing mechanism 69 allows the screen to be returned to the same position and additional ink applied to complete an image. As shown in FIGS. 1 and 4, the presently preferred indexing is a series of spring-loaded pins 71, positioned along the recess 49 located along the top of one of the side walls 33 of the cabinet 11. The spring-loaded pins force the frame 57 against the other side wall 31. This provides side-to-side indexing. Front-to-rear indexing is provided by pulling the frame 57 against the rear wall 35.

While metal is the preferred material for creating the screen frame 57, wood can be utilized. In either case, the lower side of the frame is covered with the mesh 59 that is coated with a photographic emulsion. When placed atop the cabinet 11, the print side, i.e., the lower side of the frame, faces the image to be created. The other side, i.e., the squeegee or ink side, faces upwardly. Screens can be reused by using a suitable material, such as an emulsion remover, to soften hardened emulsions and, then, washing them to remove the emulsions. After pressure washing, screens should be scrubbed with a suitable degreaser before being reused. As discussed above, preferably, the invention is used in an off contact printing manner, rather than on contact printing manner, i.e., the print side of the screen is not in physical contact with the print receiving substrate except when it is pressed downwardly by a squeegee. Preferably the space between the print receiving surface and the screen is approximately ⅛ inch.

FIGS. 3A, 3B, and 3C are plan views of various shaped platens. FIG. 3A illustrates the preferred shape 55a for use with adult-sized garments, such as T-shirts and sweat shirts. FIG. 3B illustrates the preferred shape 55b for use with child-sized garments; and FIG. 3C illustrates the preferred shape 55c for use with elongate portions of garments, such as sleeves or legs.

In addition to being used as an all-in-one screen printing machine, the machine can also be configured to form an artist's light table by placing the translucent sheet 19 beneath the transparent support plate 21 and exposing the UV lamps 41. This allows art work to be created on the same machine that does the screen printing.

Because the housing of an all-in-one screen printing machine formed in accordance with the invention is formed of metal, it can readily withstand the high temperatures that occur during the curing of many screen printed designs. The inclusion of a vertically adjustable platen formed of metal and a precise print screen registration mechanism creates precise, artistically gratifying designs.

While a preferred embodiment of the invention has been illustrated and described, it is to be understood that the invention can be practiced otherwise than as described herein. For example, the cabinet could be sized to be counter supported, rather than floor supported, in which case the shelf could form the bottom of the cabinet. Or the recess that supports the image support and the frame could be defined by angle or other brackets rather than by undercuts in the top of the cabinet walls. Further, the cabinet can be mounted on casters for ease of movement. Hence, it is to be understood that within the scope of the appended claims various changes can be made to the embodiment of the invention described above.

The embodiments of the invention in which an exclusive property or privilege is claimed are defined as follows:

1. An all-in-one screen printing machine that can be easily reconfigured to (i) create an image-bearing screen; (ii) use the image-bearing screen to print designs on suitable substrates; and (iii) heat the designs to set the print ink, said all-in-one screen printing machine comprising:
   (a) a metal cabinet that includes a pair of side walls each having upper edges and a horizontal shelf located beneath the upper edges of the side walls;
   (b) ultraviolet light means mounted on the shelf;
   (c) support means located above the shelf for selectively supporting either an image support or a print screen;
   (d) an image support sized to be supported by the support means and suitable for supporting an image;
   (e) a print screen comprising a frame and a layer of mesh affixed to the frame, the frame sized to be supported by the support means;
   (f) a platen for supporting a substrate suitable for receiving a screen print;
   (g) an adjustable platen support mounted in said cabinet for adjustably positioning the platen below the support means; and
   (h) a heater mounted on the cabinet and positionable to heat a substrate supported by the platen.

2. The all-in-one screen printing machine claimed in claim 1, wherein the cabinet includes a back wall and the platen support is mounted on the back wall.

3. The all-in-one screen printing machine claimed in claim 2, wherein the platen includes a platen plate and a downwardly extending arm and wherein the adjustable platen support includes an aperture for receiving the downwardly extending arm and locking means for vertically locking the downwardly extending arm in position.

4. The all-in-one screen printing machine claimed in claim 1, wherein the support means comprises recesses located in the upper edges of the pair of side walls.

5. The all-in-one screen printing machine claimed in claim 4, wherein the cabinet includes a back wall and the platen support is mounted on the back wall.

6. The all-in-one screen printing machine claimed in claim 5, wherein the platen includes a platen plate and a downwardly extending arm and wherein the adjustable platen support includes an aperture for receiving the downwardly extending arm and locking means for vertically locking the downwardly extending arm in position.

7. The all-in-one screen printing machine claimed in claim 4, wherein the recesses include indexing means for controlling the position of the frame of a print screen when a print screen is mounted in said recesses.

8. The all-in-one screen printing machine claimed in claim 7, wherein the cabinet includes a back wall and the platen support is mounted on the back wall.

9. The all-in-one screen printing machine claimed in claim 8, wherein the platen includes a platen plate and a downwardly extending arm and wherein the platen support includes an aperture for receiving the downwardly extending arm and locking means for vertically locking the downwardly extending arm in position.

10. The all-in-one screen printing machine claimed in claim 7, wherein said image support comprises a sheet of transparent material.

11. The all-in-one screen printing machine claimed in claim 10, wherein said frame of said print screen is formed of aluminum and wherein said screen mesh is located on one side of said frame.

12. The all-in-one screen priming machine claimed in claim 11, including a cover for covering said ultraviolet light means.

13. The all-in-one screen printing machine claimed in claim 1, wherein said image support comprises a sheet of transparent material.

14. The all-in-one screen printing machine claimed in claim 13, wherein said frame of said print screen is formed of aluminum and wherein said screen mesh is located on one side of said frame.

15. The all-in-one screen printing machine claimed in claim 14, including a cover for covering said ultraviolet light source.

16. The all-in-one screen printing machine claimed in claim 1, wherein said frame of said print screen is formed of aluminum and wherein said screen mesh is located on one side of said frame.

17. The all-in-one screen printing machine claimed in claim 16, including a cover for covering said ultraviolet light source.

18. The all-in-one screen printing machine claimed in claim 1, wherein said frame of said print screen is formed of aluminum and wherein said screen mesh is located on one side of said frame.

* * * * *

UNITED STATES PATENT AND TRADEMARK OFFICE
CERTIFICATE OF CORRECTION

PATENT NO. : 5,355,791
DATED : October 18, 1994
INVENTOR(S) : J.R. Benedetto et al.

It is certified that error appears in the above-indentified patent and that said Letters Patent is hereby corrected as shown below:

| COLUMN | LINE | |
|---|---|---|
| 3 | 49 | "wails 31" should read --walls 31-- |
| 3 | 65 | "sheet 1.9" should read --sheet 19-- |
| 8 | 31 | "priming" should read --printing-- |

Signed and Sealed this

Thirty-first Day of January, 1995

Attest:

BRUCE LEHMAN

*Attesting Officer*   *Commissioner of Patents and Trademarks*